Figure 1:
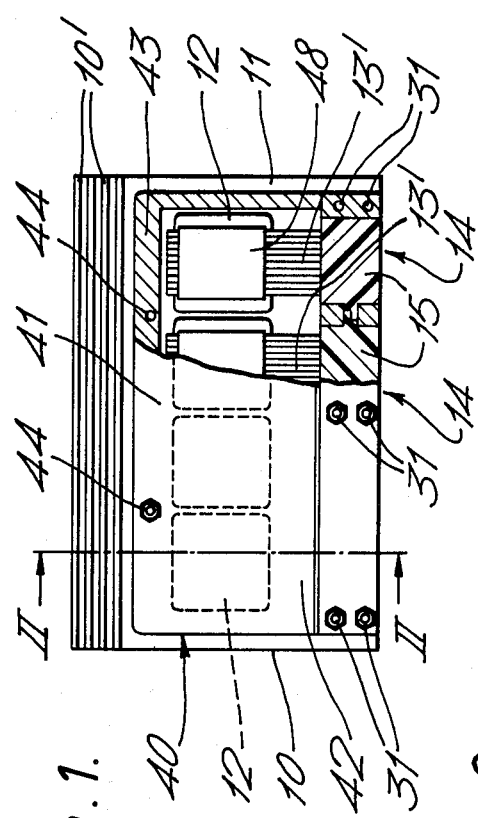

United States Patent [19]
> Bell et al.

[11] 4,369,485
[45] Jan. 18, 1983

[54] CIRCUIT ASSEMBLIES EACH WITH A COMPONENT COOPERATING WITH A CONNECTOR AND CLAMP TO A SUBSTRATE

[75] Inventors: Melvyn R. Bell, Crossgates; Ian D. Gooch, Edinburgh, both of Scotland

[73] Assignee: Ferranti Limited, Cheadle, England

[21] Appl. No.: 134,464

[22] Filed: Mar. 27, 1980

[30] Foreign Application Priority Data

Mar. 31, 1979 [GB] United Kingdom ............... 7911359
Nov. 23, 1979 [GB] United Kingdom ............... 7940614

[51] Int. Cl.³ ............................................. H05K 7/20
[52] U.S. Cl. ................................... 361/386; 361/388; 339/17 LC
[58] Field of Search ............................ 357/75, 79, 81; 339/17 CF, 17 LC, 64 R, 112 R, 198 H, 206 R, 207 R, 208; 174/16 HS, 52 FP; 361/381–383, 386–389, 393, 400, 405, 413, 426, 428

[56] References Cited

U.S. PATENT DOCUMENTS

| | | | |
|---|---|---|---|
| 3,641,474 | 2/1972 | Owens | 339/112 R |
| 3,820,044 | 6/1974 | Holland | 331/81 A |
| 3,899,719 | 8/1975 | Murphy | 361/405 |
| 3,942,854 | 3/1976 | Klein | 339/112 R |
| 4,037,270 | 7/1977 | Ahmann | 361/385 |

FOREIGN PATENT DOCUMENTS

| | | |
|---|---|---|
| 507108 | 6/1939 | United Kingdom . |
| 1066734 | 4/1967 | United Kingdom . |
| 1212158 | 11/1970 | United Kingdom . |
| 1254508 | 11/1971 | United Kingdom . |

*Primary Examiner*—G. P. Tolin
*Attorney, Agent, or Firm*—Kerkam, Stowell, Kondracki & Clarke

[57] ABSTRACT

A circuit assembly comprises a planar substrate 10 supporting, on a surface 11, connectors 14 and modules 12, the connector pieces of the connectors, and the module leads, both extending at least substantially parallel to said one major substrate surface, and the modules are clamped to the substrate in a readily releasable manner by means 40, so that a module can be replaced readily, for example, when faulty, and there may be a resilient part 48 of the clamping means between each module and a rigid part 41 of the clamping means, so that the module is not damaged by the clamping action; possibly the resilient part being provided by a composite structure of the resilient part and insulating sleeves 13' for module leads; and the clamping means including at least part of the connectors, so that the required clamping action is at least partially between the substrate and the connectors.

12 Claims, 4 Drawing Figures

CIRCUIT ASSEMBLIES EACH WITH A COMPONENT COOPERATING WITH A CONNECTOR AND CLAMP TO A SUBSTRATE

This invention relates to circuit assemblies, and in particular to circuit assemblies each having at least one component, comprising either a discrete component or a module, with leads extending therefrom, and an at least substantially planar substrate upon which each constituent component is supported, possibly the at least substantially planar substrate comprising a heat sink.

In accordance with the main claim of our co-pending U.S. patent application Ser. No. 081,572 now Continuing Application Ser. No. 288,807 a circuit assembly comprises an at least substantially planar substrate, on at least one major surface of which substrate is supported at least one component with leads extending therefrom, and there is also supported on said one major surface of the substrate at least one connector having a plurality of electrically conducting connector pieces, each connector piece both co-operating with a lead of said at least one component, and providing a terminal of the circuit assembly, the plurality of connector pieces being secured to a block of electrical insulating material of the connector.

It is, in particular, to such a circuit assembly that the present invention relates.

It is convenient, when more than one component is provided within the circuit assembly, to provide individually a connector for each constituent component, different connectors being provided for the different components. For convenience, in this specification and the accompanying claims, a connector will be considered as being associated only with one component of the circuit assembly, unless otherwise appropriate.

Because both said at least one component, and the connector, are supported on the same major surface of the at least substantially planar substrate the location within the circuit assembly of said at least one component and of the terminals of the circuit assembly, is facilitated. Thus, it is possible easily to provide the required electrical interconnections between the leads of said at least one component, and the terminals of the circuit assembly, without the necessity of including a printed circuit board within the circuit assembly.

It is an object of the present invention to provide such a circuit assembly of a form as described and claimed in our above-mentioned co-pending U.S. patent application and having a construction facilitating the replacement of said at least one component, for example, when faulty.

According to the present invention a circuit assembly comprises an at least substantially planar substrate, on at least one major surface of which substrate is supported at least one component with leads extending therefrom, and there is also supported on said one major surface of the substrate at least one connector connected to said at least one component, the connector having a plurality of electrically conducting connector pieces, each connector piece both cooperating with a lead of the component, the connector piece extending parallel to at least substantially the whole of the lead to which the connector piece is connected and providing a terminal of the circuit assembly, the plurality of connector pieces are secured to a block of electrical insulating material of the connector, and the arrangement is such that said at least one component or module is secured within the circuit assembly in a readily detachable manner by readily releasable clamping means provided in the circuit assembly, the required clamping action being between the substrate and the clamping means.

The connector may be secured to the substrate in any convenient way; and is considered to include the means securing it to the substrate. The connector may have a known construction.

When more than one component or module is provided within the circuit assembly common clamping means may be provided.

Thus, said at least one component or module is secured to the substrate in a readily detachable manner.

The connector and said at least one module or component connected thereto may comprise a sub-assembly unit, the sub-assembly unit to be secured to the substrate to complete the circuit assembly. The securing of the connector to the substrate may be in a readily detachable manner, for example, the connector being clamped to the substrate in a readily releasable manner. In addition, or alternatively, said at least one module or component is secured to the insulating block in a readily detachable manner. Possibly, the connector pieces are secured to the insulating block in a readily detachable manner, to be replaced with said at least one component, the connector pieces possibly being detachably secured within bores in the insulating block by each being a press fit therein. Alternatively, said at least one component is secured to the connector pieces in a readily detachable manner.

The leads may extend from two opposing surfaces of said at least one component and each lead extends at least substantially in one of two planes, in which planes the leads extend, the leads from one surface of the component exclusively extend at least substantially in one of the two planes parallel to said one major surface of the substrate, and leads extending from different surfaces of the component extend in different planes parallel to said one major surface of the substrate.

The clamping means for said at least one component or module may comprise a rigid part, and a resilient part between the rigid part and said at least one component, the arrangement being such that said at least one component is not damaged by the clamping action.

At least some of the leads may be covered with electrical insulating material, and the resilient part of the clamping means for said at least one component may be between the electrical insulating material covering the leads and the rigid part of the clamping means. The resilient part of the clamping means and the electrical insulating material covering the leads may comprise a composite structure, possibly before inclusion in the circuit assembly.

The leads of said at least one component may be secured to the connector pieces in any convenient manner.

The connector pieces may be secured to the block of insulating material of the connector in any convenient way.

Whilst each connector piece may have any convenient form, it may comprise a socket part integral with a spigot part, the socket part being connected to a lead of said at least one component, and the spigot part comprising a terminal of the circuit assembly.

More than one component or module may be connected to a connector, and/or more than one connector may be connected to a component or module, but as stated above, it is convenient, when more than one component or module is provided within the circuit assembly, to provide individually a connector for each constituent component or module.

A plurality of connectors may be provided within the circuit assembly. More than one connector may be provided on said one major surface of the substrate; and/or at least one connector may be provided on each of both opposing major surfaces of the substrate. With the latter arrangement, the leads of said at least one component or module may extend along each of both opposing major surfaces of the substrate; and/or at least one constituent module or component of the circuit assembly is provided on each of both opposing major surfaces of the substrate.

The at least substantially planar substrate of the circuit assembly may comprise a heat sink; or may be of electrical insulating material.

According to another aspect the present invention comprises the combination of a circuit assembly of any one of the forms referred to above, and at least one associated connector to co-operate, and mate, with the connector or connectors of the circuit assembly.

Either a common associated connector, or a plurality of associated connectors, may co-operate, and mate, with a plurality of connectors of the circuit assembly. Usually, each connector of the circuit assembly so provided extends linearly along a linear edge of the substrate.

The, or each, associated connector may have a known form.

According to yet another aspect the present invention comprises the combination of at least one first circuit assembly, each first circuit assembly being of any one of the forms referred to above as a circuit assembly according to the present invention, and at least one second circuit assembly, the combination comprising a more complex circuit assembly than any constituent circuit assembly.

When more than one constituent module and/or component is provided in a circuit assembly according to the present invention, required electrical interconnections between the components and/or modules may be provided by a second circuit assembly.

The circuit assembly according to the present invention and said second circuit assembly may be connected together in any convenient way to form a more complex circuit assembly than any constituent circuit assembly.

Said at least one second circuit assembly may at least include a pattern of conductors on an electrical insulating support, such as a printed circuit board.

Modules and/or components of the more complex circuit assembly may be provided in said at least one second circuit assembly.

Said at least one second circuit assembly may be connected directly to the terminals of said at least one first circuit assembly, or a connector, comprising the associated connector referred to above, may be provided between each second circuit assembly and each co-operating first circuit assembly to be connected to the second circuit assembly, the associated connector possibly having a known form.

The present invention will now be described by way of example with reference to the accompanying drawings, in which;

FIG. 1 is a plan view, partially sectioned, of a circuit assembly comprising one embodiment in accordance with the present invention.

Figure 2:
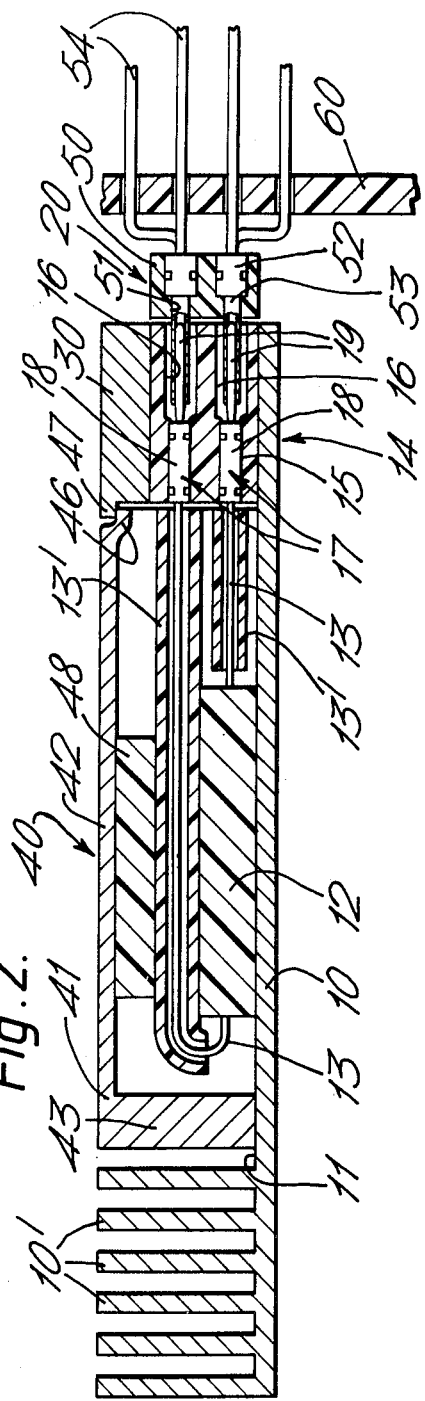
Figure 3:
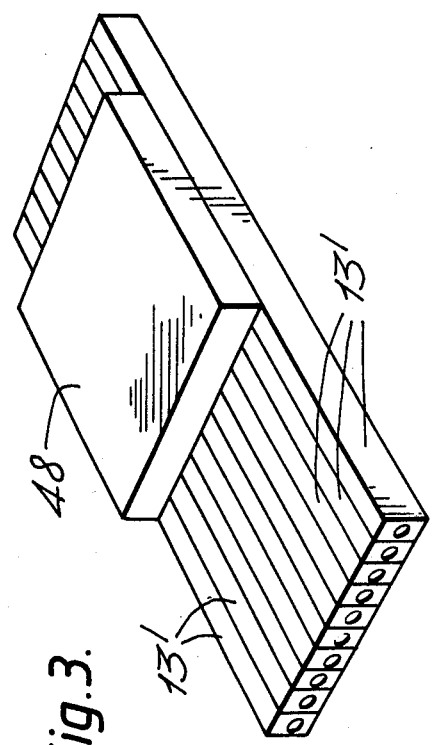
Figure 4:
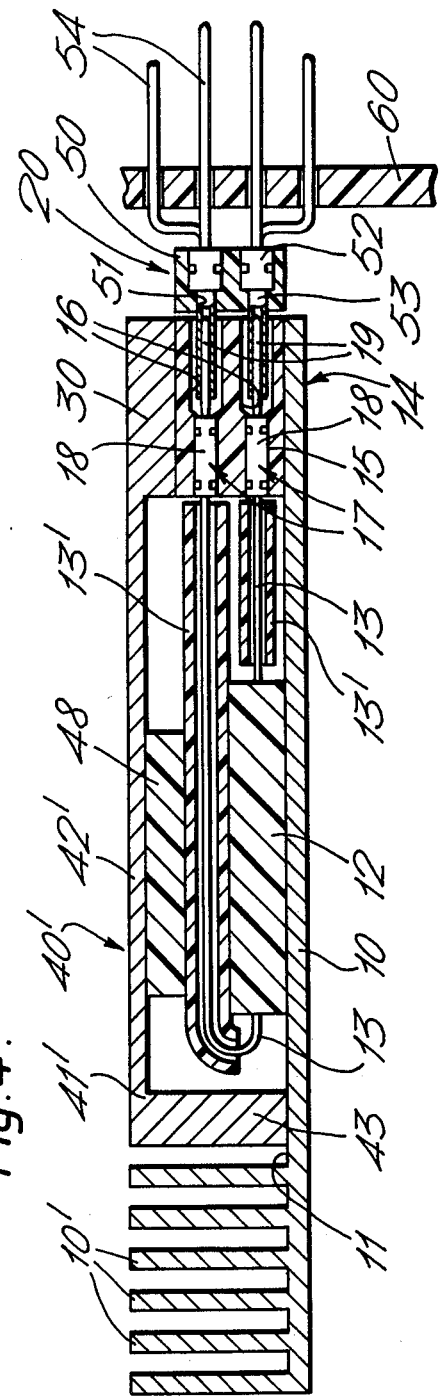

FIG. 2 is a section on the line II—II of the circuit assembly of FIG. 1, comprising a first circuit assembly, together with an associated connector co-operating with the connectors of the first circuit assembly, and part of a second circuit assembly, FIG. 3 is a perspective view of a composite electrically insulating structure of the first circuit assembly of FIGS. 1 and 2, the structure both insulating leads of a module, and facilitating the clamping of the module to the substrate of the circuit assembly without damage to the module, and FIG. 4 corresponds to FIG. 2 but is of a modified form of circuit assembly in accordance with the present invention.

The illustrated circuit assembly has a substantially planar substrate comprising a heat sink 10 of aluminium the substrate being rectangular shaped in plan. Supported on one major surface 11 of the heat sink 10 are four, square shaped in plan, modules 12, each module 12 having a plurality of leads 13 (shown only in FIG. 2), extending from each of two opposing surfaces of each module. Four connectors 14, also comprising parts of the circuit assembly, are provided, the connectors extending along, and adjacent to, one edge of the major surface 11 of the heat sink 10. The leads 13 extend at least substantially in two parallel planes, these planes being parallel to the module-bearing surface 11 of the substrate 10.

In order to facilitate the extraction of heat from the heat sink 10, the heat sink is provided with fins 10', and so the heat sink is only substantially planar in form.

Each connector 14 includes a block 15 of electrical insulating material, in bores 16 in each of which blocks 15 are provided a plurality of electrically conducting connector pieces 17 (shown only in FIG. 2), with a connector piece 17 individually in each bore 16. Each connector piece 17 has a socket part 18 to receive a module lead 13, and an integral spigot part 19, comprising a terminal of the circuit assembly, the terminal to co-operate with a socket of a connector 20, shown only in FIG. 2, to be associated with the circuit assembly, and to abut against one surface of the block. The associated connector 20 has a known construction.

Because both the modules 12 and the connectors 14 are supported on the major surface 11 of the heat sink 10, the location within the circuit assembly of the modules, and of the terminals 19, is facilitated. Thus, it is possible easily to provide a desired circuit assembly, and in particular to provide the required electrical interconnections between the modules 12 and the terminals 19, without the necessity of including a printed circuit board within the circuit assembly.

Each connector piece extends parallel to at least substantially the whole of the lead to which the connector piece is connected. Thus, the connector pieces extend parallel to each other, parallel to the major surface 11 of the substrate. The connector pieces also extend at right angles both to a surface of the insulating block, against which surface is to abut the associated connector 20, and to an opposing surface of the insulating block.

In fabricating the circuit assembly, initially the socket parts 18 of the connector pieces 17 of the connector 14 are secured to the leads 13 of the modules 12. Then the connector pieces 17 are secured within each block 15 of insulating material. Alternatively, in an unillustrated arrangement, the connector pieces 17 are secured to the block of insulating material before the connector pieces are secured to the module leads. With either such arrangement, the combination of the insulating block, and the module secured thereto, comprises a sub-assembly unit to be secured to the substrate 10 when completing the circuit assembly.

The socket part 18 of each connector piece 17 is arranged to be capable of being tightened around the co-operating module lead 13 before the connector piece 17 is inserted into its bore 16 in the block 15. Each socket part may not comprise a complete cylinder, but may comprise any convenient construction having at least one portion to be tightened around the co-operating module lead 13. The construction of the connector piece 17 as a whole is such that the connector piece is a press fit within the bore 16 of the block 15, after the connector piece has been secured to a module lead 13. Each connector piece 17 does not extend beyond the bore 16, and so is embedded within the block 15.

Each block of electrical insulating material is clamped to the substrate by a bridging member 30 of the connector. The bridging member 30 is secured to the substrate by screws 31, the screws extending through bores (not shown). The common bridging member spans each insulating block 15, and has four constituent parts, each such part individually spanning an insulating block. Each constituent part of the common bridging member 30 has four, square-shaped in section, legs 34, with a leg 34 at each corner of the portion of the bridging member part to span an insulating block of the connector, each leg extending normally to the spanning portion. Each adjacent constituent pair of parts of the common bridging member shares a common pair of legs, there being five pairs of legs provided for the four illustrated connectors. Each insulating block is a close fit between opposing surfaces of the two pairs of square shaped legs 34 of the connector including the insulating block. The bores for the screws 31, securing the common bridging member to the substrate, extend through three spaced pairs of legs of the bridging member.

Adjacent pairs of the electrical insulating blocks 15 co-operate with each other in any convenient way, in addition to co-operating with the common bridging member. Further, the shape of the electrical insulating blocks is such that the blocks are interchangeable with each other within the circuit assembly.

Desirably, the form of the circuit assembly is such that the modules 12 are readily replaceable, for example, when faulty, and it is required that the modules 12 are detachably secured within the circuit assembly in a readily releasable manner. Hence, it is convenient to provide an arrangement in which the modules are not directly secured to the substrate. In particular, the modules do not adhere to the substrate, and clamping means 40 is provided within the circuit assembly for the modules.

The clamping means 40 includes a rigid part 41 having a portion 42 to span the modules 12, and a flange 43 to be between the spanning portion 42 and the substrate 10. A common rigid part 41 is provided for the four modules of the circuit assembly. Screws 44 extend through the flange 43 to secure the rigid part 41 to the substrate in a readily releasable manner. The flange 43 extends along three edges of the spanning portion 42, and the fourth edge of the spanning portion is provided with a lip-shaped portion 46. As shown in FIG. 2, the lip-shaped portion 46 is to co-operate with the common bridging member 30 of the connectors 14, also considered to be part of the clamping means, by engaging with a flange 47 on the bridging member, (for convenience not shown in FIG. 1), and being held in engagement with the flange 47 by the resilient action of parts 48 also included in the clamping means 40, between the modules 12 and the common spanning portion 42 of the rigid part 41. The arrangement is such that the required clamping action for the modules is provided between the substrate and the clamping means, and, in particular, between the substrate and the spanning portion 42 of the rigid part 41 of the clamping means. The provision of the resilient parts 48 prevents the modules being damaged by the clamping action. Part of the clamping action is between the substrate and the connectors, via the rigid part 41 of the clamping means.

Each resilient part 48 of the clamping means is part of a composite structure included within the circuit assembly, the resilient part being secured to insulating sleeves 13' for the module leads before being included within the circuit assembly, the composite structure being shown in FIG. 3. The insulating sleeves 13' secured to the resilient part 48 are to cover the module leads extending in the plane, of the two planes in which the leads extend, which is further from the substrate. Insulating sleeves 13' are also provided for the module leads extending in the other of the two planes in which the leads extend, but these insulating sleeves are not secured to the resilient part 48 of the clamping means. Alternatively, the insulating sleeves provided for the module leads extending in the other of the two planes in which the leads extend also are secured to the resilient part 48, and are included within the composite structure before being included within the circuit assembly.

The composite structure, of either form referred to in the preceding paragraph, may not be provided before inclusion within the circuit assembly, the insulating sleeves being secured to resilient parts of the clamping means after the insulating sleeves have been placed on the module leads.

The securing of each insulating block to the substrate is in a readily detachable manner because the bridging member 30 is secured to the substrate in a readily detachable manner. Possibly an insulating block 15 is replaced with a module 12. In addition, or alternatively, each module 12 is secured to an insulating block in a readily detachable manner, possibly the connector pieces 17 being secured to the insulating block in a readily detachable manner, to be replaced with the module, for example, the connector pieces being a press fit within bores 16 in the insulating block as described above. Alternatively, the leads 11 of each module are secured to the connector pieces in a readily detachable manner.

As shown in FIG. 2, the associated connector 20 comprises a block 50 of electrical insulating material, in bores 51 in which block 50 are provided a plurality of electrically conducting connector pieces 52, with a connector piece 52 individually in each bore 51. Each connector piece 52 has a socket part 53, shown partially cut-away in FIG. 2, and to co-operate with a spigot part 19 of a connector of the circuit assembly. For this purpose a portion of the socket 53 extends beyond the associated bore 51. Within the bore 51 the socket part 53 is secured to a conductor 54 co-operating with a second circuit assembly shown generally at 60. For convenience, in the illustrate arrangement, adjacent pairs of conductors 54 of the associated connector 20, whilst extending substantially wholly parallel to each other, are in four spaced, parallel, planes, to facilitate making electrical contact therewith.

The modified circuit assembly in accordance with the present invention, and shown in FIG. 4, corresponds to the circuit assembly of FIGS. 1 and 2, and the same reference numerals are used in both FIGS. 2 and 4 to identify identical or closely resembling parts of the two illustrated circuit assemblies.

The circuit assembly of FIG. 4 differs from that of FIGS. 1 and 2 in that the clamping means 40', whilst being considered as including the bridging member 30 of the connector 14, has a module spanning portion 42', of the rigid part 41', integral with the bridging member 30. Again, part of the clamping action is between the substrate 10 and the connectors 14.

Instead of providing a common associated connector, a plurality of associated connectors may co-operate, and mate, with the plurality of connectors 14.

The leads may extend from only one surface of each module, and extend in only, one, common, plane parallel to the module-bearing surface of the substrate, and the insulating sleeves covering these leads may be part of composite structures with the resilient parts of the clamping means. Alternatively, the resilient parts may be contiguous with the bodies of the modules, rather than with the module leads.

It is not essential to provide such composite structures within the circuit assembly, for example, the resilient parts being only contiguous with the sleeves for the module leads, and being secured thereto.

It may be possible to omit the resilient parts from the clamping means.

Separate clamping means may be provided for each constituent module of the circuit assembly.

The clamping means may have any convenient form, and may be secured within the circuit assembly in any convenient readily releasable way.

The clamping means may not be arranged to co-operate with the connectors provided within the circuit assembly.

At least one module of the illustrated circuit assembly may be omitted, and at least one discretely packaged component, possibly only having two leads extending therefrom, provided instead, there being at least one module or component provided in the circuit assembly. There may be provided only one module and one connector within the circuit assembly.

It is not essential that all the connector pieces 17 of the provided connector 14 co-operate with modules or components. Thus, for example, one of the illustrated modules 12 may be omitted from the circuit assembly, or different modules having different numbers of leads may be provided.

More than one component or module may be connected to a connector, and/or more than one connector may be connected to a component or module.

The modules may have any convenient construction, and for example, comprise thin film modules of known forms.

Components, when provided, may comprise any known forms of components, such as resistors and capacitors.

The connector pieces 17 may be secured to a block 15 in any convenient way instead of being a press fit in bores therein.

Each connector of the circuit assembly may have any convenient form, and may be supported on the substrate in any convenient way.

The leads may be secured to the connector pieces in any convenient manner.

The connector pieces may have any convenient form. The connector pieces may not be substantially embedded in an insulating block, but instead the connector pieces may be at least partially exposed after being secured to the insulating block.

The at least substantially planar substrate may not comprise a heat sink, for example, being of electrical insulating material. If the connector is not required to be readily detachable with said at least one component, the insulating block of the connector may be integral with the electrical insulating substrate.

At least one connector may be provided on each of both opposing major surfaces of the substrate. With the latter arrangement, the leads of said at least one component may extend along each of both opposing major surfaces of the substrate; and/or at least one constituent component of the circuit assembly is provided on each of both opposing major surfaces of the substrate.

The circuit assembly described above may have a modified form as described and claimed in our co-pending U.S. Patent application Ser. No. 134,462 said at least one constituent module or component being required to have leads extending at least substantially in at least one plane parallel to said one major surface of the substrate, and the block of electrical insulating material is retained by at least one bridging member of the connector, and the arrangement is such that, with the bridging member secured to the substrate, the block co-operates with the bridging member to be retained between the bridging member and the substrate in a manner which permits movement of the block relative to the substrate, and relative to the bridging member, in a plane normal to said one major surface of the substrate. Hence, the insulating block is in a retained, but floating, relationship with the bridging member, and the substrate.

The permitted movement of the block ensures that the manufacturing tolerances in relation to the block are larger than otherwise would be required. Further, the permitted movement of the block facilitates the alignment of the block in the predetermined position within the circuit assembly when the connector is mated with an associated connector, the mating with the associated connector causing the block to move into the predetermined position, and to be appropriately aligned in this predetermined position. Aligning means also may be provided, to facilitate the obtaining of this criterion. It is required that the block is held firmly within the circuit assembly when the connector is mated with the associated connector.

The permitted movement of the block relative to the substrate, and relative to the bridging member, may be along either one or both or two othogonal axes within the plane normal to said one major surface of the substrate. The extent of the permitted movement of the block along the, or either, orthogonal axis may be substantially equal to the width of a connector piece along the axis.

The circuit assembly described above in addition, or alternatively, may have a modified form as described and claimed in our co-pending U.S. Patent application Ser. No. 134,463 said at least one constituent component being required to have leads extending from two opposing surfaces thereof, the leads from one surface of the component exclusively extend at least substantially in one of two planes parallel to said one major surface of the substrate, in which planes the leads extend, and leads extending from different surfaces of the component extend in different planes parallel to said one major surface of the substrate, and the block of insulating material is in two separable parts, the two separable block parts being stacked one on the other, and are rigidly secured to the substrate in any convenient way, within the completed circuit assembly, and the leads extending from one surface of the component are connected exclusively to the connector pieces secured to one of the two separable block parts, the leads extending from different surfaces of the component being connected to the connector pieces secured to different separable block parts, and the connections between the connector pieces and the leads are at least partially protected by the connections being on, or within, or adjacent to, the insulating block.

By providing an insulating block comprising two separable parts, conveniently, the leads extending from one surface of the component or module can be secured to their associated connector pieces and to their associated separable part of the insulating block, and the leads extending from the other surface of the component or module conveniently can be secured to their associated connector pieces and to their associated separable part of the insulating block, before the component or module, and the insulating block, are supported on the substrate of the circuit assembly. Subsequently, and conveniently, the leads are bent into their relative positions required in the completed circuit assembly, with the two separable parts of the insulating block being stacked one on the other. In this form, the component or module, and the insulating block, together comprise a sub-assembly unit of the circuit assembly. The sub-assembly unit then is secured to the substrate to complete the circuit assembly. Hence, the connections between the connector pieces and the leads are at least partially protected whilst the component or module, and the insulating block, are being secured to the substrate. The connector pieces may be secured to the separable parts of the insulating block either before, or after, the leads of the component or module are secured to the connector pieces.

At least one first circuit assembly, comprising a circuit assembly referred to as a circuit assembly according to the present invention, and of any one of the forms described above, may be connected to at least one second circuit assembly 60, as shown in FIG. 2, to form a more complex circuit assembly than any constituent circuit assembly, the more complex circuit assembly being in accordance with another aspect of the present invention. Each second circuit assembly, possibly, has at least one connector, comprising the associated connector 20 referred to above, to co-operate, and mate, with the connector or connectors of the first circuit assembly, although co-operating first and second circuit assemblies may be connected together in any convenient way.

The required electrical interconnections between a plurality of constituent modules and/or components of a first circuit assembly may be provided by a second circuit assembly.

Said at least one second circuit assembly may at least include a pattern of conductors on an electrical insulating support, such as a printed circuit board.

At least one module or component of the more complex circuit assembly may be provided in said at least one second circuit assembly.

Any such arrangement is advantageous in that designing the construction of the more complex circuit assembly is facilitated; it is easy to remove a first circuit assembly with a faulty component or module; and it is possible to have a standard construction for each first circuit assembly, and perhaps also it is possible to have a standard construction for each second circuit assembly, for each of a plurality of different possible more complex circuit assemblies, each different possible first circuit assembly, and perhaps also each different possible second circuit assembly, respectively, varying from each other only in the form of, and/or in the number of, constituent modules and/or components, where appropriate.

What we claim is:

1. A circuit assembly comprising an at least substantially planar substrate, on at least one major surface of which substrate is supported at least one component with leads extending therefrom, and there is also supported on said one major surface of the substrate at least one connector connected to said at least one component, the connector having a plurality of electrically conducting connector pieces, each connector piece extending parallel to and co-operating with a lead of the component, and providing a terminal of the circuit assembly, the plurality of connector pieces are secured to a block of electrical insulating material of the connector, and the arrangement is such that said at least one component is secured within the circuit assembly in a readily detachable manner by readily releasable clamping means provided in the circuit assembly, the required clamping action being between the substrate and the clamping means, the clamping means for said at least one component including at least part of the connector, the required clamping action being at least partially between the substrate and the connector by a cooperating flange and lip hyphen-shaped portion provided by the clamping means and the connector, the leads extending from said at least one component substantially in one plane parallel to said one major surface of the substrate.

2. A circuit assembly as claimed in claim 1 in which said at least one component and the connector connected thereto comprise a sub-assembly unit.

3. A circuit assembly as claimed in claim 1 in which the connector is secured to the substrate in a readily detachable manner.

4. A circuit assembly as claimed in claim 1 in which said at least one component is secured to the insulating block of the connector connected thereto in a readily detachable manner.

5. A circuit assembly as claimed in claim 3 in which the connector pieces are secured to the insulating block in a readily detachable manner.

6. A circuit assembly as claimed in claim 3 in which said at least one component is secured to the connector pieces in a readily detachable manner.

7. A circuit assembly as claimed in claim 1 in which the leads extend from two opposing surfaces of said at least one component, each lead extends at least substantially in one of two planes parallel to said one major surface of the substrate, and in which planes the leads extend, the leads from one surface of the component exclusively extend at least substantially in one of the two planes parallel to said one major surface of the substrate, and leads extending from different surfaces of the component extend in different planes parallel to said one major surface of the substrate.

8. A circuit assembly as claimed in claim 1 in which the clamping means for said at least one component comprises a rigid part, and a resilient part between the rigid part and said at least one component.

9. A circuit assembly as claimed in claim 8 having at least some of the leads covered with electrical insulating material, and the resilient part of the clamping means for said at least one component is between the electrical insulating material covering the leads and the rigid part of the clamping means.

10. A circuit assembly as claimed in claim 9 in which the resilient part of the clamping means and the electrical insulating material covering the leads comprise a composite structure.

11. A circuit assembly as claimed in claim 1 in which the at least substantially planar substrate comprises a heat sink.

12. A circuit assembly as claimed in claim 1 in which the at least substantially planar substrate is of electrical insulating material.

* * * * *